United States Patent
Kamtekar

(10) Patent No.: US 10,733,874 B2
(45) Date of Patent: Aug. 4, 2020

(54) NANOPARTICLES

(71) Applicants: Cambridge Display Technology Limited, Godmanchester (GB); Sumitomo Chemical Company Limited, Tokyo (JP)

(72) Inventor: Kiran Kamtekar, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 16/309,887

(22) PCT Filed: Jun. 15, 2017

(86) PCT No.: PCT/GB2017/051756
§ 371 (c)(1),
(2) Date: Dec. 13, 2018

(87) PCT Pub. No.: WO2017/216570
PCT Pub. Date: Dec. 21, 2017

(65) Prior Publication Data
US 2019/0348638 A1 Nov. 14, 2019

(30) Foreign Application Priority Data
Jun. 17, 2016 (GB) .................................. 1610642.9

(51) Int. Cl.
*H01L 51/50* (2006.01)
*G08B 29/08* (2006.01)
*G08B 29/18* (2006.01)
*C08F 12/32* (2006.01)
(Continued)

(52) U.S. Cl.
CPC .............. *G08B 29/08* (2013.01); *C08F 12/32* (2013.01); *G08B 29/188* (2013.01); *H01L 51/0003* (2013.01); *H01L 51/0035* (2013.01); *H01L 51/0039* (2013.01); *H01L 51/5268* (2013.01); *H01L 51/5072* (2013.01); *H01L 51/5092* (2013.01); *H01L 2251/5369* (2013.01); *H01L 2251/552* (2013.01)

(58) Field of Classification Search
CPC .................. H01L 51/0039; H01L 51/5072
See application file for complete search history.

(56) References Cited

U.S. PATENT DOCUMENTS

2009/0039766 A1* 2/2009 Meijer .................. B82Y 30/00
                                                          313/504
2011/0215304 A1  9/2011 Wada et al.

OTHER PUBLICATIONS

International Search Report and Written Opinion for International Application No. PCT/GB2017/051756, dated Sep. 14, 2017.
(Continued)

*Primary Examiner* — Thomas L Dickey
(74) *Attorney, Agent, or Firm* — Wolf, Greenfield & Sacks, P.C.

(57) ABSTRACT

A cationic nanoparticulate material comprises polymer and a $BF_4^-$, $PF_6^-$ or $SbF_5^-$ counterion. A layer of an organic electronic device, such as an organic light-emitting device, comprises the nanoparticulate material dispersed in an organic semiconducting layer.

20 Claims, 3 Drawing Sheets

(51) Int. Cl.
  *H01L 51/00*     (2006.01)
  *H01L 51/52*     (2006.01)

(56) References Cited

OTHER PUBLICATIONS

Combined Search and Examination Report for British Application No. GB1610642.9, dated Jan. 24, 2017.
Döbbelin et al., Electrochemical synthesis of PEDOT derivatives bearing imidazolium-ionic liquid moieties. Journal of Polymer Science Part A: Polymer Chemistry. 2009;47(12):3010-21.
Yu et al., Synthesis of new crosslinked porous ammonium-based poly(ionic liquid) and application in CO 2 adsorption. Polymer Engineering and Science. 2013;54(1):59-63.

* cited by examiner

NANOPARTICLES

RELATED APPLICATIONS

This Application is a national stage filing under 35 U.S.C. § 371 of international PCT application PCT/GB2017/051756, filed Jun. 15, 2017, which claims priority to United Kingdom patent application GB 1610642.9, filed Jun. 17, 2016, each of which is incorporated herein by reference in its entirety.

FIELD OF THE INVENTION

The invention relates to nanoparticles, methods of forming said nanoparticles and use thereof in electronic devices.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED has a substrate carrying an anode, a cathode and an organic light-emitting layer containing a light-emitting material between the anode and cathode.

In operation, holes are injected into the device through the anode and electrons are injected through the cathode. Holes in the highest occupied molecular orbital (HOMO) and electrons in the lowest unoccupied molecular orbital (LUMO) of the light-emitting material combine to form an exciton that releases its energy as light.

Uses of OLEDs include use as displays and as lighting devices.

U.S. Pat. No. 5,917,279 discloses an OLED having a layer containing nanoparticles dispersed in a polymer binder.

It is an object of the invention to provide nanoparticles suitable for use in a layer of an organic electronic device, particularly an organic light-emitting device.

It is a further object of the invention to provide nanoparticles showing good dispersion in organic solvents.

SUMMARY OF THE INVENTION

The present inventors have found that use of a counterion such as $BF_4^-$ with a cationic nanoparticulate material can improve dispersion of the nanoparticulate material in a solvent, in particular organic solvents, enabling formation of films comprising well-dispersed nanoparticulate material.

Accordingly, in a first aspect the invention provides a cationic nanoparticulate material comprising a $BF_4^-$, $PF_6^-$ or $SbF_5^-$ counterion.

The nanoparticulate material may be a non-polymeric or polymeric material.

The nanoparticulate material may be provided in a composition with one or more other material. The composition may be in the form a film in which the nanoparticulate material is dispersed within a matrix material.

The composition may comprise the nanoparticulate material and an organic semiconducting material. A film of this composition may form a layer of an organic electronic device, preferably an organic light-emitting device. In the case of an OLED used as a light source, such as a white light-emitting OLED, a light-scattering effect of the dispersed nanoparticles may result in improved light-emitting properties of the OLED as compared to an OLED that does not contain the nanoparticles.

The nanoparticles may be provided in a formulation comprising the nanoparticles dispersed in a solvent. Preferably, the formulation further comprises a matrix material, optionally an organic semiconducting material, dissolved or dispersed (preferably dissolved) in the solvent.

A film of the nanoparticles dispersed in the matrix material may be formed by depositing a formulation comprising the nanoparticles and the matrix material onto a surface and evaporating the solvent.

The term nanoparticles is used to mean particles which are small in size, typically having a diameter or characteristic dimension in the range 10 nm to 200 nm. Molecules are therefore not nanoparticles as defined herein.

DESCRIPTION OF THE DRAWINGS

The invention will now be described in more detail with reference to the drawings in which.

DETAILED DESCRIPTION OF THE INVENTION

Figure 1:
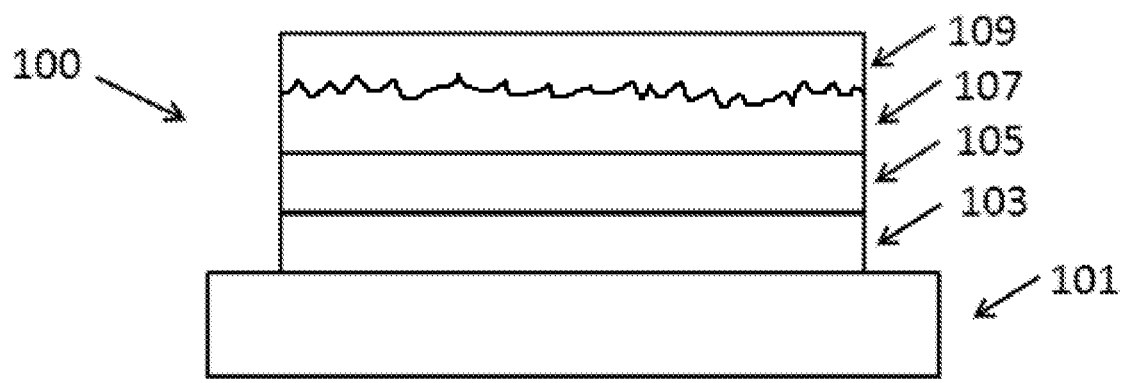
FIG. 1 illustrates schematically an OLED according to an embodiment of the invention.

The cationic nanoparticulate material described herein may be a polymer or a non-polymeric material. Preferably, the cationic nanoparticulate material is a polymer.

The polymer may be a homopolymer comprising a first repeat unit substituted with at least one cationic substituent, or may be a copolymer comprising one or more first repeat units substituted with at least one cationic substituent and one or more further repeat units that are unsubstituted or substituted with one or more non-ionic substituents.

The first repeat unit may have formula (I):

wherein:
BB is a backbone group;
$R^1$ is a substituent;
n is at least 1;
x is at least 1;
$R^2$ is a non-ionic substituent;
$Z^-$ is selected from $BF_4^-$, $PF_6^-$ and $SbF_5^-$; and
y is 0 or a positive integer.

The repeat unit of formula (I) may have formula (Ia):

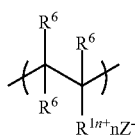

(Ia)

wherein $R^6$ in each occurrence is independently H or a non-ionic substituent $R^2$.

The group $R^1$ may be a group of formula (II):

$$—(Sp^1)_z\text{-}X \quad (II)$$

Wherein $Sp^1$ is a non-ionic spacer group; z is 0 or 1; and X is a cationic group.

Optionally, $Sp^1$ is selected from: $C_{1-20}$ alkylene wherein one or more non-adjacent C atoms may be replaced with O; $Ar^2$; a group of formula $—C_{1-12}$ alkylene-$Ar^2$—; and a group of formula $Ar^2—C_{1-12}$ alkylene, wherein $Ar^2$ is selected from a $C_{6-20}$ arylene group or a 5-20 membered heteroarylene group which may be unsubstituted or substituted with one or more substituents. Substituents of $Sp^1$, if present, are optionally selected from F; D; CN; $C_{1-12}$ alkyl; and $C_{1-12}$ alkoxy.

$Ar^2$ is preferably phenylene.

Preferably, $Sp^1$ is phenylene-methylene (benzylene).

Optionally, X is a group comprising or consisting of at least one quaternised pyridine.

X may comprise a pyridine wherein the N atom of the pyridine is quaternised with a group $R^4$, wherein $R^4$ is a substituent.

X may comprise an ammonium group, optionally a group of formula $—N^+(R^4)_3$ wherein $R^4$ in each occurrence is independently a substituent.

Optionally, X is a group of formula (III):

(III)

wherein $Ar^1$ independently in each occurrence is a $C_{6-20}$ monocyclic or polycyclic heteroaromatic group which may be unsubstituted or substituted with one or more substituents; $R^4$ is a substituent; and v is 0 or 1.

Preferably, $Ar^1$ in each occurrence is independently selected from 6 membered heteroaromatic rings of carbon and nitrogen atoms, more preferably pyridine.

Preferably, $R^4$ is a $C_{1-20}$ hydrocarbyl group, optionally a group selected from $C_{1-12}$ alkyl; unsubstituted phenyl; and phenyl substituted with one or more $C_{1-12}$ alkyl groups.

Exemplary groups X include the following:

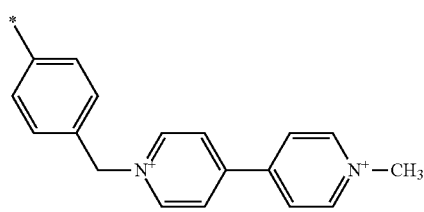 [SMILES: *c1ccc(C[n+]2ccc(-c3cc[n+](C)cc3)cc2)cc1]

wherein -* is a bond to the polymer backbone.

Groups $R^2$, if present, are optionally selected from $C_{1-20}$ hydrocarbyl groups, optionally a group selected from $C_{1-12}$ alkyl; unsubstituted phenyl; and phenyl substituted with one or more $C_{1-12}$ alkyl groups.

A repeat unit of formula (Ia) may be formed by polymerisation of a monomer of formula (Ia-M), optionally with one or more further monomers for forming one or more further repeat units:

(Ia-M)

The repeat units of the nanoparticulate polymer preferably consist of the first repeat unit and one or more, optionally 1, 2 or 3, further repeat units wherein each further repeat unit is independently unsubstituted or substituted with one or more non-ionic substituents. Non-ionic substituents of a further repeat unit may be selected from groups $R^2$.

Optionally the further repeat units, if present, comprise or consist of repeat units of formula (IV):

(IV)

wherein $R^6$ is as described above. Optionally, each $R^6$ is H or only one $R^6$ is a substituent $R^2$ in the or each further repeat unit of formula (IV).

An exemplary repeat unit of formula (IV) is styryl.

In the case of a copolymer, the first repeat unit optionally makes up 0.1-10 mol %, optionally 0.5-5 mol %, of the repeat units of the polymer, the or more further repeat units making up the remaining repeat units of the polymer.

The polymer may be a crosslinked polymer. Optionally, the polymer is crosslinked by including a crosslinking monomer in a polymerisation mixture used to form the polymer. Optionally, the crosslinking monomer is a diene, optionally divinylbenzene.

A polymer for forming a nanoparticulate polymer as described herein may be formed by polymerisation of a monomer for forming a precursor of a first repeat unit as described herein wherein the precursor of the first repeat unit comprises an anion other than $BF_4^-$, $PF_6^-$ or $SbF_5^-$, for example halide, followed by anion exchange with $BF^{4-}$, $PF_6^-$ or $SbF_5^-$ to form the repeat unit of formula (I), for example as illustrated below:

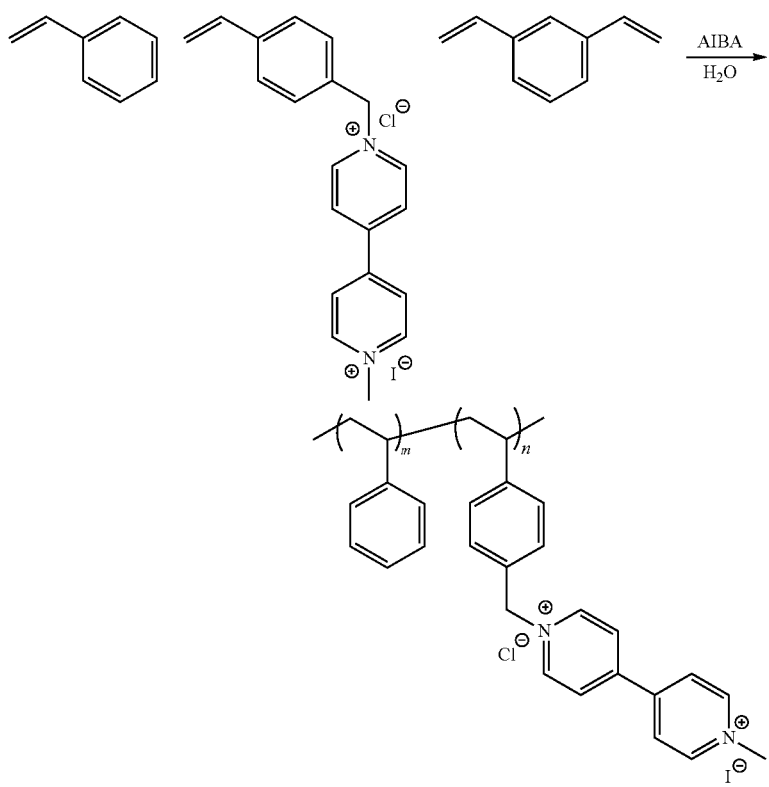

wherein n is 1 mol %; m is 90 mol %; and the divinylbenzene crosslinking monomer makes up the remaining 9 mol % of the monomers. Nanoparticles may be formed as described in J. Am. Chem. Soc. 2010, 132, 14251, the contents of which are incorporated herein by reference.

The nanoparticulate material may for example have an average nanoparticle size of 50-200 nm, optionally 100-150 nm, as measured by dynamic light scattering using a Malvern Nanosizer available from Malvern Instruments Ltd. The size of a polymeric nanoparticulate material may be controlled during polymerisation by selection of the ratio of monomers for forming the first repeat unit to monomers for forming the one or more further monomers; and duration of the polymerisation reaction.

Solvents

A film comprising the nanoparticles dispersed in a matrix may be formed from a formulation comprising or consisting of a solvent, the nanoparticles and a matrix material by depositing the formulation on a surface and evaporating the solvent.

A "solvent" of a formulation comprising nanoparticles as described herein means a liquid of a single solvent material or a mixture of two or more solvent materials. It will be appreciated that the nanoparticulate material is dispersed in the solvent. Other components of the formulation, for example one or more organic semiconductor material(s), may each be dissolved or dispersed, preferably dissolved, in the solvent.

The or each solvent material of a solvent may be a polar or non-polar solvent material.

Non polar solvent materials are preferably aprotic. Exemplary non-polar solvent materials are chloroform, benzenes substituted with one or more substituents selected from $C_{1-10}$ alkyl and $C_{1-10}$ alkoxy groups, for example toluene, xylenes and methylanisoles, and mixtures thereof. Non polar aprotic solvent materials are preferably aprotic solvents having a dielectric constant of less than 8.

Polar solvent materials may be protic or aprotic, preferably protic. Exemplary protic solvent materials are water and alcohols, for example methanol ethanol, propanol, butoxyethanol, ethylene glycol, 1-methoxy-2-propanol and monofluoro-, polyfluoro- or perfluoro-alcohols, optionally 2,2,3,3,4,4,5,5-octafluoro-1-pentanol. Exemplary aprotic polar solvent materials are dimethylsulfoxide; propylene carbonate; and 2-butanone. Aprotic polar solvents preferably have a dielectric constant of at least 15 or at least 20.

The solvent is preferably a polar solvent material or a mixture of two or more polar solvent materials. The solvent preferably comprises or consists of a polar organic solvent.

Organic Semiconducting Material

Organic semiconducting materials as described herein may be polymeric or a non-polymeric materials. The polymer may be a homopolymer or a copolymer comprising two or more different repeat units.

Preferably, the organic semiconducting material is a polymer, more preferably a conjugated polymer. By "conjugated polymer" as used herein is meant a polymer having a backbone comprising or consisting of repeat units that are conjugated to one another.

Conjugated polymers as described herein suitably have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of polymers described anywhere herein may be $1\times10^3$ to $1\times10^8$, and preferably $1\times10^4$ to $1\times10^7$.

Conjugated polymers comprising repeat units of formula (I) may be formed by polymerising monomers comprising leaving groups that leave upon polymerisation of the monomers to form conjugated repeat units. Exemplary polymerization methods include, without limitation, Yamamoto polymerization as described in, for example, T. Yamamoto, "Electrically Conducting And Thermally Stable pi-Conjugated Poly(arylene)s Prepared by Organometallic Processes", Progress in Polymer Science 1993, 17, 1153-1205, the contents of which are incorporated herein by reference and Suzuki polymerization as described in, for example, WO 00/53656, WO 2003/035796, and U.S. Pat. No. 5,777,070, the contents of which are incorporated herein by reference.

Conjugated polymers as described herein are suitably amorphous polymers.

Optionally, the polymer backbone comprises repeat units comprising arylene or heteroarylene groups that are conjugated to arylene or heteroarylene groups of adjacent repeat units.

Optionally, the polymer comprises repeat units of formula (V):

—(Ar²)—           (V)

wherein $Ar^2$ is an $C_{6-20}$ arylene group or a 5-20 membered heteroarylene group which may be unsubstituted or substituted with one or more substituents.

Preferably, the or each repeat unit of formula (V) is selected from unsubstituted or substituted $C_{6-20}$ arylene groups.

Exemplary $C_{6-20}$ arylene groups include, without limitation, 1,2-linked phenylene, 1,3-linked phenylene, 1,4-linked phenylene, 2,7-linked fluorene, 3,6-linked fluorene, 2,8-linked indenofluorene; 1,4-linked naphthalene; 2,6- or 9,10-linked anthracene; and 2,7-linked phenanthrene.

Substituents of $Ar^2$ may be selected according to the desired solubility of the polymer in a solvent. Substituents of $Ar^2$ may be selected from non-ionic substituents and ionic substituents.

Where present, the one or more substituents of a repeat unit of formula (V) may be selected from substituents $R^3$ wherein $R^3$ in each occurrence is independently selected from:

- alkyl, optionally $C_{1-20}$ alkyl, wherein one or more non-adjacent methylene groups of the alkyl, if present, may be replaced with O, S, C=O or —COO and one or more H atoms may be replaced with F; and
- a group of formula —(Ar³)ᵣ wherein $Ar^3$ in each occurrence is independently a $C_{6-20}$ aryl or 5-20 membered heteroaryl group that is unsubstituted or substituted with one or more substituents and r is at least 1, optionally 1, 2 or 3; and
- ionic substituents.

$Ar^3$ is preferably phenyl. Substituents of $Ar^3$, if present, may independently be selected from substituents $R^{13}$ wherein $R^{13}$ in each occurrence is independently $C_{1-20}$ alkyl wherein one or more non-adjacent methylene groups may be replaced with O.

It will be understood that "methylene group" of an alkyl group as used herein means a CH₂— group of a linear, branched or cyclic alkyl chain and does not include a CH₂ group forming part of a methyl group at the or each end of a linear or branched alkyl chain.

"Ionic substituent" as used herein means a substituent that consists of a cationic or anionic group or a substituent that comprises one or more cationic or anionic groups.

Ionic substituents may be selected from substituents of formula (VI):

—(Sp²)p-(A)q           (VI)

wherein $Sp^2$ is a spacer group; A is an anion or cation; p is 0 or 1; q is 1 if p is 0; and q is at least 1, preferably 1, if p is 1.

Optionally, $Sp^2$ is selected from $C_{1-20}$ alkylene, $C_{6-20}$ arylene, $C_{6-20}$ arylene-$C_{1-20}$ alkylene or $C_{1-20}$ alkylene-$C_{6-20}$ arylene wherein one or more non-adjacent methylene groups of the $C_{1-20}$ alkylene may be replace with O, S or C=O.

$C_{6-20}$ arylene groups of $Sp^2$ are preferably phenylene.

$C_{6-20}$ arylene groups of $Sp^2$ may be unsubstituted or substituted with one or more $C_{1-20}$ alkyl groups wherein one or more non-adjacent methylene groups of the $C_{1-20}$ alkyl group may be replaced with O, S, C=O or COO.

"Alkylene" as used herein means a branched or linear divalent alkyl chain.

Preferably, $Sp^2$ is selected from:

$C_{1-20}$ alkylene wherein one or more non-adjacent methylene groups may be replaced with O, S or CO; and a $C_{6-20}$ arylene, more preferably phenylene, which may be unsubstituted or substituted with one or more substituents. Substituents, if present, are preferably selected from ether groups, optionally polyether groups, preferably a group of formula —O(CH₂CH₂O)ᵥ—$R^{12}$ wherein v is at least 1, optionally an integer from 1 to 10, and $R^{12}$ is a $C_{1-5}$ alkyl group, preferably methyl.

An exemplary anion A is —COO⁻.

An exemplary cation A is —NR¹⁶₃⁺ wherein $R^{16}$ in each occurrence is H or $C_{1-12}$ hydrocarbyl. Preferably, each $R^{16}$ is a $C_{1-12}$ hydrocarbyl.

If a repeat unit of formula (V) is substituted with one or more anionic or cationic substituents then the polymer comprises counterions to balance the change of the ionic substituent or substituents.

An ionic substituent of a repeat unit of formula (V) and a counterion may have the same valency, the counterion balancing the charge of the ionic substituent.

The charge of two or more ionic groups may be balanced by a single counterion, optionally a di- or tri-valent counterion.

A cationic counterion is optionally a metal cation, optionally Li⁺, Na⁺, K⁺, Cs⁺, preferably Cs⁺, or an organic cation, optionally ammonium, such as tetraalkylammonium, ethylmethyl imidazolium or pyridinium.

An anionic counterion may be selected from halide; a sulfonate group, optionally mesylate or tosylate; hydroxide; carboxylate; sulfate; phosphate; phosphinate; phosphonate; or borate.

The substituents $R^3$ may be selected according to the desired solubility of the polymer in a solvent.

Preferred non-ionic substituents $R^3$ are ether groups, optionally polyether groups. (Poly)ether groups may have formula —O(CH₂CH₂O)ᵥ—$R^{12}$ wherein v is at least 1, optionally an integer from 1 to 10, and $R^{12}$ is a $C_{1-5}$ alkyl group, preferably methyl.

The conjugated polymer may contain only one repeating unit of formula (V) or may contain two or more different repeating units of formula (V).

The repeat units of the polymer may comprise one or more repeat units of formula (V) and one or more further repeat units, or all repeat units of the polymer may be one or more repeat units of formula (V).

A preferred repeat unit of formula (V) has formula (Va):
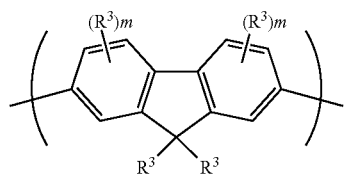
wherein m independently in each occurrence is 0 or a positive integer, preferably 0.
Exemplary repeat units of formula (V) are:
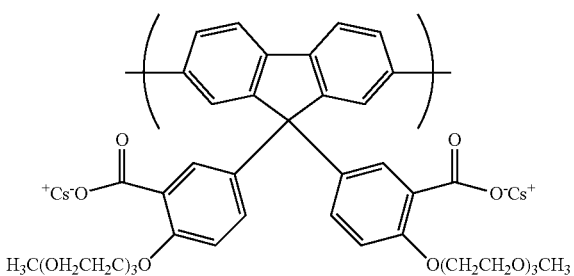
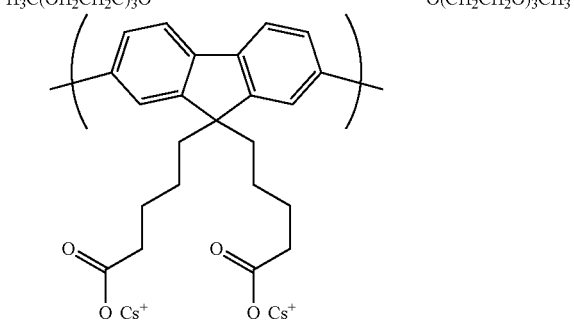
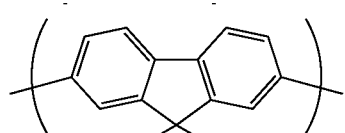
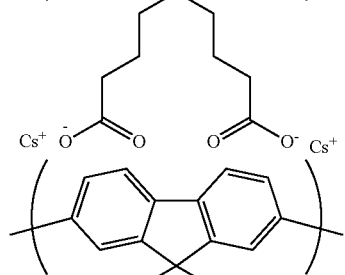
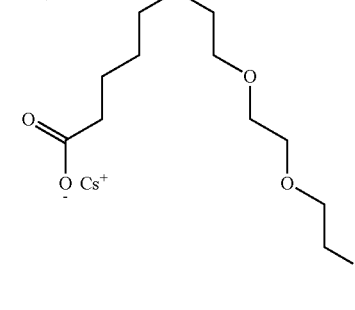
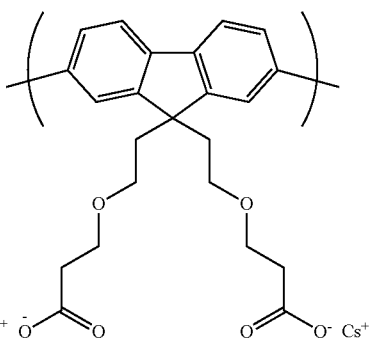
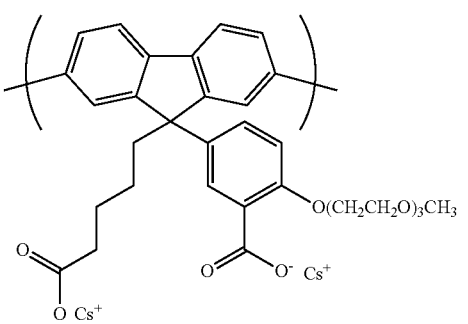
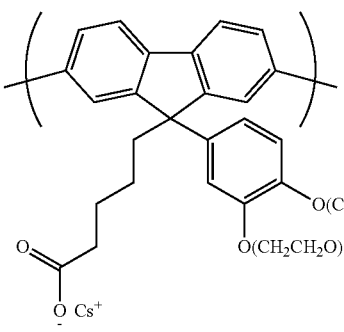
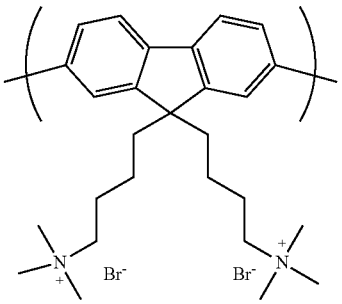
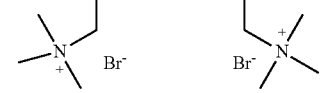

-continued

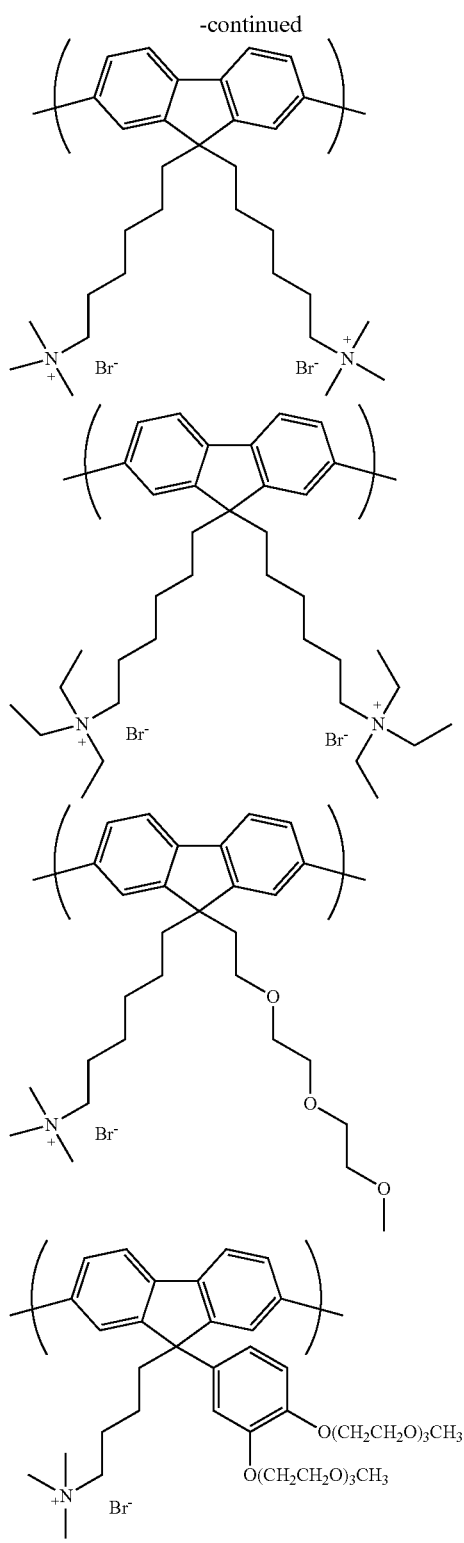

The properties of the organic semiconducting material may be selected according to the use of the composition comprising the organic semiconducting material and the nanoparticulate material.

Preferably, the organic semiconducting material is an electron-transporting material.

Preferably, the organic semiconducting material the material has a LUMO of less (i.e. closer to vacuum) than 3.0 eV from vacuum level, optionally around 2.1 to 2.8 eV from vacuum level. Preferably, the organic semiconducting material has a LUMO level of no more than 2.7 eV or no more than 2.6 eV from vacuum level. Preferably, the organic semiconducting material has a LUMO level of more (i.e. further from vacuum) than 2.2 eV or 2.3 eV from vacuum level.

HOMO and LUMO levels as described herein are as measured by square wave voltammetry.

Devices

A film comprising a matrix material and the nanoparticulate material may be a layer of an organic electronic device. Organic electronic devices include, without limitation, organic field effect transistors; organic photovoltaic devices; organic photodetector devices; and organic light-emitting devices.

The matrix: nanoparticle ratio may be in the range of 0.05-5 wt %.

FIG. 1, which is not drawn to any scale, illustrates an OLED 100 according to an embodiment of the invention supported on a substrate 101, for example a glass or plastic substrate. The OLED 100 comprises an anode 103, a light-emitting layer 105, an electron-transporting layer 107 comprising the nanoparticulate material, and a cathode 109.

The anode 103 may be single layer of conductive material or may be formed from two or more conductive layers. Anode 103 may be a transparent anode, for example a layer of indium-tin oxide. A transparent anode 103 and a transparent substrate 101 may be used such that light is emitted through the substrate. The anode may be opaque, in which case the substrate 101 may be opaque or transparent, and light may be emitted through a transparent cathode 109.

Light-emitting layer 105 contains at least one light-emitting material. Light-emitting material 105 may consist of a single light-emitting material or may be a mixture of more than one material, optionally a host doped with one or more light-emitting dopants. Light-emitting layer 105 may contain at least one light-emitting material that emits phosphorescent light when the device is in operation, or at least one light-emitting material that emits fluorescent light when the device is in operation. Light-emitting layer 105 may contain at least one phosphorescent light-emitting material and at least one fluorescent light-emitting material.

Electron-transporting layer 107 comprises or consists of the nanoparticulate material dispersed in an electron-transporting material.

Preferably, the electron-transporting material has a LUMO that is no more than about 1 eV, optionally less than 0.5 eV or 0.2 eV, deeper (i.e. further from vacuum) than a LUMO of a material of the light-emitting layer, which may be a LUMO of a light-emitting material or a LUMO of a host material if the light-emitting layer comprises a mixture of a host material and a light-emitting material.

Optionally, the electron-transporting layer has a thickness in the range of 5-100 nm, optionally 10-50 nm.

Optionally, the average nanoparticle size is greater than the thickness of the electron-transporting layer, optionally greater by at least 10 nm, creating a non-uniform surface between the electron-transporting layer and layers deposited over the electron-transporting layer, as shown in FIG. 1 wherein the electron-transporting layer—cathode interface is non-uniform. This non-uniformity may enhance light scattering.

In forming the electron-transporting layer, the solvent material or materials of a formulation comprising the nanoparticulate material and a matrix material may be selected to avoid dissolution of an underlying layer that the electron-transporting layer is formed on. Preferably, the electron-transporting layer is formed on a light-emitting layer. Preferably, the light-emitting layer is formed by deposition of a formulation comprising the component or components of the light-emitting layer dissolved or dispersed in, preferably dissolved in, one or more non-polar solvent materials, and the electron-transporting layer is formed by deposition of a formulation comprising the components of the electron-transporting layer and one or more polar solvent materials.

Preferably, the electron-transporting layer 107 is adjacent to organic light-emitting layer 105.

Cathode 109 is formed of at least one layer, optionally two or more layers, for injection of electrons into the device. The cathode is preferably adjacent to electron-transporting layer 107.

The cathode may consist of a single material such as a layer of aluminium. Alternatively, it may comprise a plurality of metals, for example a bilayer of a low work function material and a high work function material such as calcium and aluminium as disclosed in WO 98/10621. The cathode may comprise or consist of one or more conductive layers, optionally one or more layers of conductive material having a work function greater than 3.5 eV, and a thin (e.g. 1-5 nm thick) layer of metal compound between the electron-transporting layer and the one or more layers of conductive material. The conductive material of a cathode as described herein may be a metal or a non-metallic conductive material. Exemplary metals having a work function of at least 3.5 eV include aluminium, magnesium, copper, silver or gold and iron, preferably magnesium or aluminium. Exemplary non-metallic conductive materials include graphite, graphene and conductive metal oxides, for example indium tin oxide and indium zinc oxide. Exemplary metal compounds include an oxide or fluoride of an alkali or alkali earth metal for example a fluoride or oxide of lithium, sodium or barium.

A metal cathode may have a reflective surface that is non-uniform due to the non-uniformity of the nanoparticles of the electron-transporting layer. This non-uniform reflective surface may enhance scattering of light.

In another embodiment, the electron-transporting layer 107 as described above may be replaced with an electron injection layer. An electron injection layer may be formed by n-doping the electron-transporting material of an electron-transporting layer as described herein. If the device comprises an n-doped electron injection layer then the cathode may comprise or consist of one or more layers of conductive material having a work function above 3.5 eV.

Work functions of metals are as given in the CRC Handbook of Chemistry and Physics, $87^{th}$ Edition, 12-114. If more than one value for a metal is given then the first value listed applies.

The OLED 100 is preferably a white-emitting OLED. White-emitting OLEDs as described herein may have a CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-6000K. A white-emitting OLED may contain a plurality of light-emitting materials, preferably red, green and blue light-emitting materials, more preferably red, green and blue phosphorescent light-emitting materials, that combine to produce white light. The light-emitting materials may all be provided in light-emitting layer 105, or one or more additional light-emitting layers may be provided.

A red light-emitting material may have a photoluminescence spectrum with a peak in the range of about more than 550 up to about 700 nm, optionally in the range of about more than 560 nm or more than 580 nm up to about 630 nm or 650 nm.

A green light-emitting material may have a photoluminescence spectrum with a peak in the range of about more than 490 nm up to about 560 nm, optionally from about 500 nm, 510 nm or 520 nm up to about 560 nm.

A blue light-emitting material may have a photoluminescence spectrum with a peak in the range of up to about 490 nm, optionally about 450-490 nm.

Photoluminescence spectra described herein are as measured by casting 5 wt % of the material in a polystyrene film onto a quartz substrate and measuring in a nitrogen environment using apparatus C9920-02 supplied by Hamamatsu.

Light-emitting materials of the OLED 100 may be fluorescent materials, phosphorescent materials or a mixture of fluorescent and phosphorescent materials. Light-emitting materials may be selected from polymeric and non-polymeric light-emitting materials. Exemplary light-emitting polymers are conjugated polymers, for example polyphenylenes and polyfluorenes examples of which are described in Bernius, M. T., Inbasekaran, M., O'Brien, J. and Wu, W., Progress with Light-Emitting Polymers. Adv. Mater., 12 1737-1750, 2000, the contents of which are incorporated herein by reference. Light-emitting layer 107 may comprise a host material and a fluorescent or phosphorescent light-emitting dopant. Exemplary phosphorescent dopants are row 2 or row 3 transition metal complexes, for example complexes of ruthenium, rhodium, palladium, rhenium, osmium, iridium, platinum or gold.

A light-emitting layer may contain a mixture of more than one light-emitting material, for example a mixture of light-emitting materials that together provide white light emission. A plurality of light-emitting layers may together produce white light.

A fluorescent light-emitting layer may consist of a light-emitting material alone or may further comprise one or more further materials mixed with the light-emitting material.

Exemplary further materials may be selected from hole-transporting materials; electron-transporting materials and triplet-accepting materials, for example a triplet-accepting polymer as described in WO 2013/114118, the contents of which are incorporated herein by reference.

The OLED 100 may contain one or more further layers between the anode 103 and the cathode 109, for example one or more charge-transporting, charge-blocking or charge-injecting layers. Preferably, the device comprises a hole-injection layer comprising a conducting material between the anode and the light emitting layer 105. Preferably, the device comprises a hole-transporting layer comprising a semiconducting hole-transporting material between the anode 103 and the light emitting layer 105 or, if a hole-injection layer is present, between the hole-injection layer and light-emitting layer 105. The OLED 100 may contain one or more light-emitting layers.

If present, a hole transporting layer located between the anode and the light-emitting layer 105 preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer in order to provide a small barrier to hole transport between these layers.

A hole-transporting layer may comprise hole-transporting materials selected from non-polymeric and polymeric hole-transporting materials. Exemplary conjugated hole-transporting polymers are polymers comprising arylamine repeat units, for example as described in WO 99/54385 or WO 2005/049546 the contents of which are incorporated herein by reference.

A hole-transporting layer may consist essentially of a hole-transporting material or may comprise one or more further materials. A light-emitting material, optionally a phosphorescent material, may be provided in the hole-transporting layer. Emission from a light-emitting hole-transporting layer and emission from light-emitting layer 105 may combine to produce white light.

A conductive hole injection layer, which may be formed from a conductive organic or inorganic material, may be provided to enhance hole injection from the anode. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Organic electronic devices are preferably encapsulated to prevent ingress of moisture and oxygen.

Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

The substrate on which the device is formed preferably has good barrier properties such that the substrate together with the encapsulant forms a barrier against ingress of moisture or oxygen. The substrate is commonly glass however alternative substrates may be used, in particular where flexibility of the device is desirable. For example, the substrate may comprise one or more plastic layers, for example a substrate of alternating plastic and dielectric barrier layers or a laminate of thin glass and plastic.

Measurements

HOMO, SOMO and LUMO levels as described anywhere herein are as measured by square wave voltammetry.

Equipment:

CHI660D Electrochemical workstation with software (IJ Cambria Scientific Ltd))

CHI 104 3 mm Glassy Carbon Disk Working Electrode (IJ Cambria Scientific Ltd))

Platinum wire auxiliary electrode

Reference Electrode (Ag/AgCl) (Havard Apparatus Ltd)

Chemicals

| Acetonitrile (Hi-dry anhydrous grade-ROMIL) | (Cell solution solvent) |
| Toluene (Hi-dry anhydrous grade) | (Sample preparation solvent) |
| Ferrocene-FLUKA | (Reference standard) |
| Tetrabutylammoniumhexafluorophosphate-FLUKA) | (Cell solution salt) |

Sample Preparation

The acceptor polymers were spun as thin films (~20 nm) onto the working electrode; the dopant material was measured as a dilute solution (0.3 w %) in toluene.

Electrochemical Cell

The measurement cell contains the electrolyte, a glassy carbon working electrode onto which the sample is coated as a thin film, a platinum counter electrode, and a Ag/AgCl reference glass electrode. Ferrocene is added into the cell at the end of the experiment as reference material (LUMO (ferrocene)=−4.8 eV).

EXAMPLES

Monomer Example 1

A charged monomer (Compound 3) was formed according to the following reaction scheme:

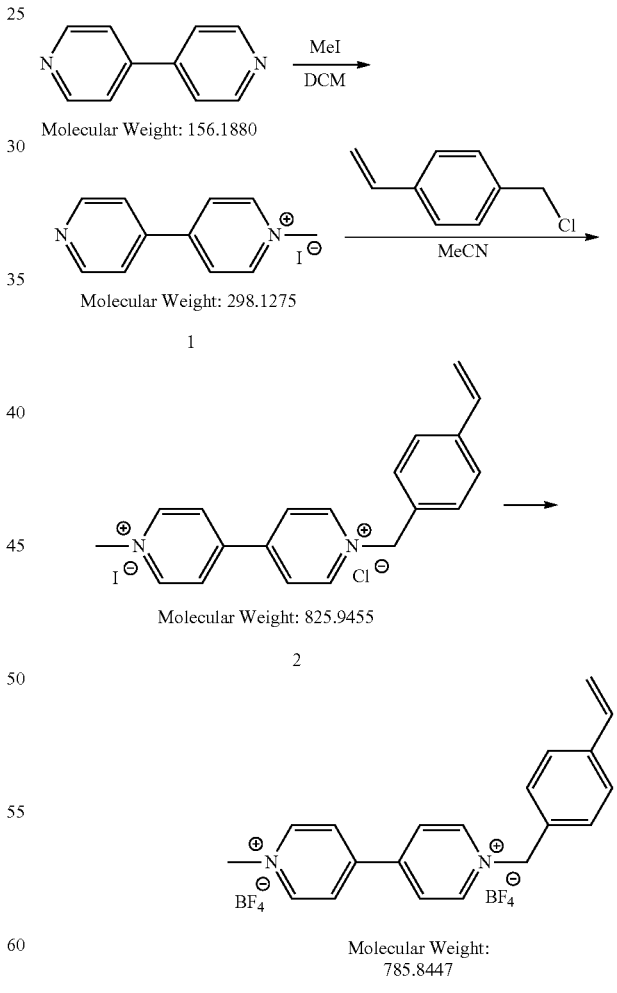

Compound 1:

A flask was charged with 4,4'-bipyridyl (10 g) and DCM (100 ml). The stirred mixture was gently warmed until all material was fully dissolved, then cooled to room temperature. Methyl iodide (5 ml) dissolved in DCM (50 ml) was added to the stirred mixture dropwise and a solid precipitate formed. The resulting slurry was stirred at room temperature (overnight), filtered, washed with DCM and dried (vacuum oven, 50° C., overnight) to yield 13.11 g (69%) of compound 1 as a solid.

Compound 2:

A stirred mixture of compound 1 (13 g) and MeCN (600 ml) was heated to 80° C. until almost all of the compound 1 had dissolved (overnight). 4-Chloromethylstyrene (21.5 ml) was added to the stirred mixture which was cooled to 60° C. for 65 h until a red precipitate had formed. The resulting precipitate was filtered, washed with MeCN and dried in a vacuum oven overnight at 50° C. This process yielded 16.71 g (85%) of compound 2 as a red powder. The structure of the resulting red powder was confirmed by NMR (DMSO-d6) and (LC)MS (confirmed +ve mass, scanning for −ve mass confirmed presence of I—).

$^1$H NMR (600 MHz, D$_2$O) δ 9.08 (d, J=6.78 Hz, 2H), 8.97 (d, J=6.68 Hz, 2H), 8.47 (br d, J=6.59 Hz, 2H), 8.44 (br d, J=6.59 Hz, 2H), 7.48-7.53 (m, J=8.19 Hz, 2H), 7.40-7.45 (m, J=8.19 Hz, 2H), 6.70 (dd, J=11.01, 17.69 Hz, 1H), 5.79-5.84 (m, 3H), 5.29 (d, J=10.92 Hz, 1H), 4.43 (s, 3H)

Compound 3:

A stirred suspension of compound 2 (1 g) in water (10 ml) was heated to 40° C. and sodium tetrafluoroborate (2.4 g) was added in one portion. The resulting mixture was heated to reflux (30 mins), cooled to 5° C., filtered, washed with cold water and dried in a vacuum oven overnight at 50° C. This process yielded 0.95 g (93%) of compound 3 as a red solid.

$^1$H NMR (600 MHz, D$_2$O) δ 9.07 (d, J=6.96 Hz, 2H), 8.96 (d, J=6.78 Hz, 2H), 8.45 (d, J=6.78 Hz, 2H), 8.42 (br d, J=6.68 Hz, 2H), 7.51-7.54 (m, J=8.19 Hz, 2H), 7.41-7.44 (m, J=8.28 Hz, 2H), 6.74 (dd, J=10.92, 17.69 Hz, 1H), 5.81-5.85 (m, 3H), 5.31 (d, J=11.01 Hz, 1H), 4.42 (s, 3H).

Polymer Example 1

A mixture of Compound 3 (0.29 g), styrene (5.2 g), divinylbenzene (0.65 g) and water (99 ml) was stirred and degassed (1 h). 2,2'-Azobis(2-methylpropionamidine) dihydrochloride (0.27 g) in water (1 ml) was added to the stirred mixture which was heated to 80° C. for 24 h. The resulting slurry was purified by dialysis against water for 7 days. This process yielded a combined mass of 106.9 g of the aqueous nanoparticle suspension.

Figure 2A:
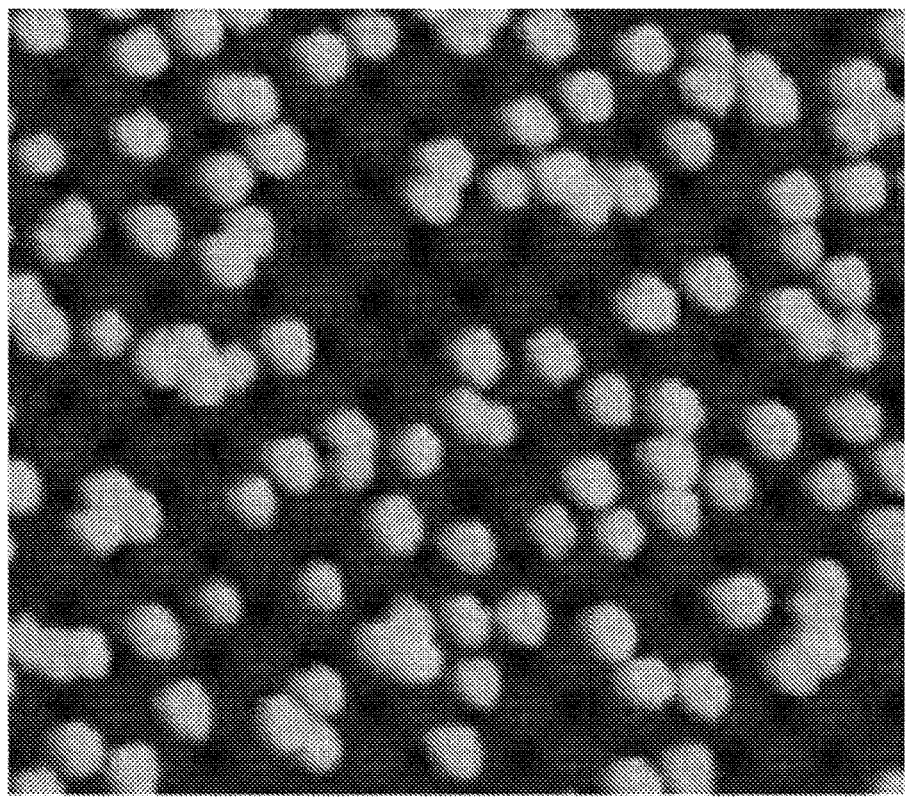
FIG. 2A is an atomic force microscope (AFM) image of a dispersion of nanoparticles according to an embodiment of the invention in a methanol/water solvent mixture.

The nanoparticles were dispersed in a methanol/water (70/30 v/v) solvent. A uniform dispersion of nanoparticles is obtained as shown in the AFM image of the dispersion of FIG. 2A.

Figure 2B:
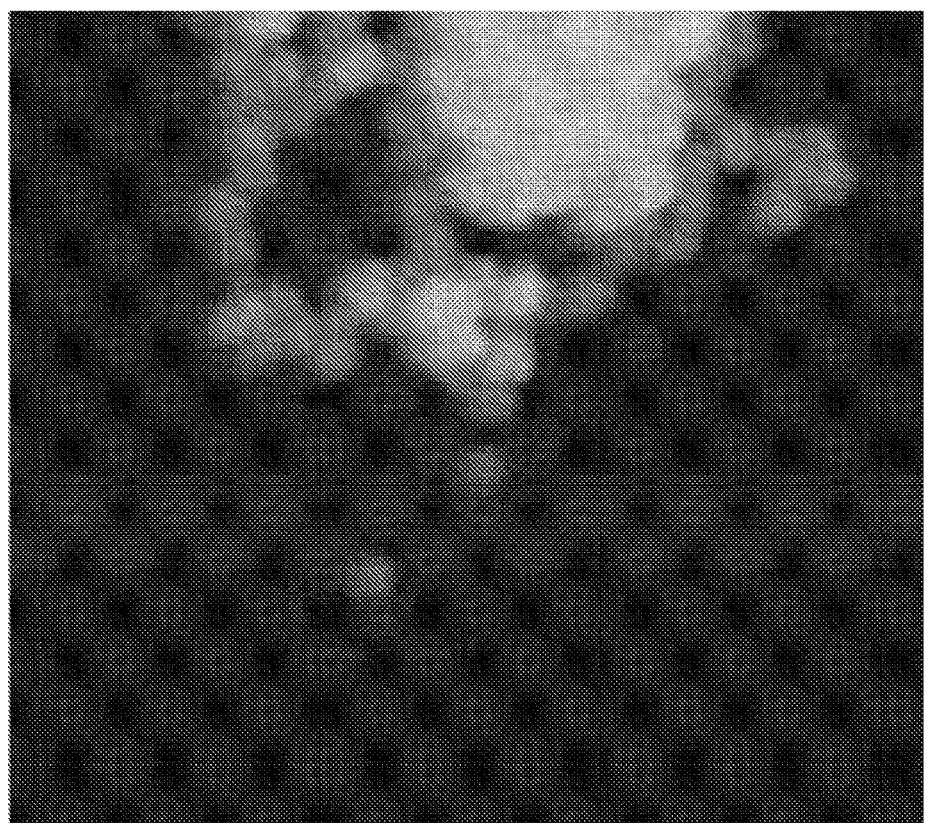
FIG. 2B is an AFM image of a dispersion of comparative nanoparticles in a methanol/water solvent mixture.

For the purpose of comparison, the untreated nanoparticles (without anion exchange) were dispersed in the methanol/water solvent. The nanoparticles were poorly dispersed, with extensive clumping together of the nanoparticles as shown in the AFM image of FIG. 2B. Ultrasound treatment of the nanoparticles did not result in significant improvement in dispersion thereof.

Figure 3A:
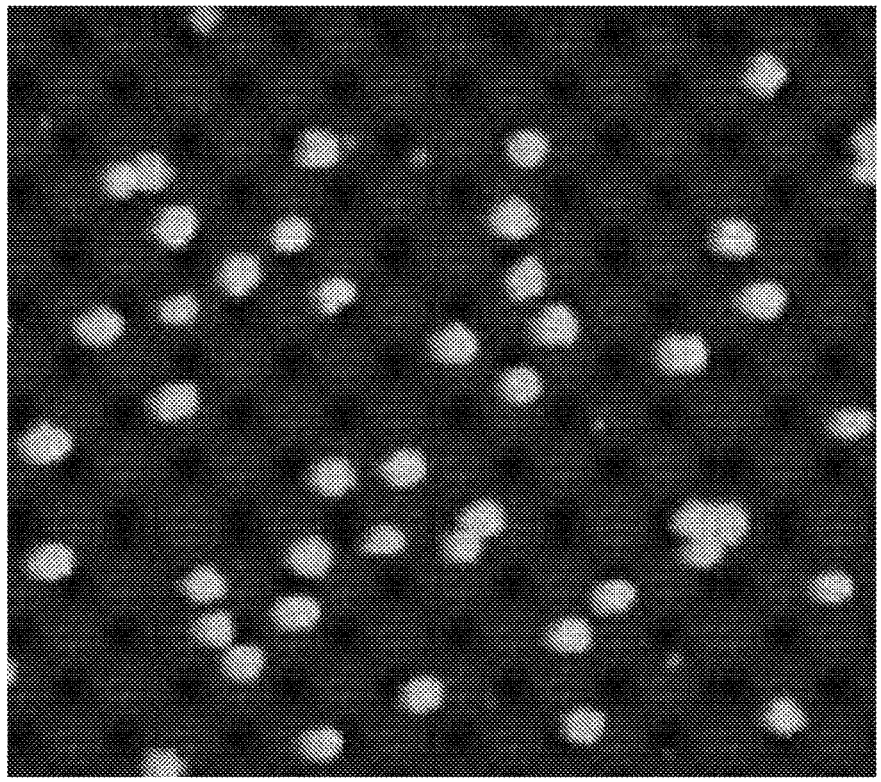
FIG. 3A is an AFM image of a dispersion of nanoparticles according to an embodiment of the invention in octofluoropentanol.

The nanoparticles having BF4$^-$ anions were dispersed in octafluoropentanol (OFP). A uniform dispersion of nanoparticles is obtained as shown in the AFM image of the dispersion of FIG. 3A.

Figure 3B:
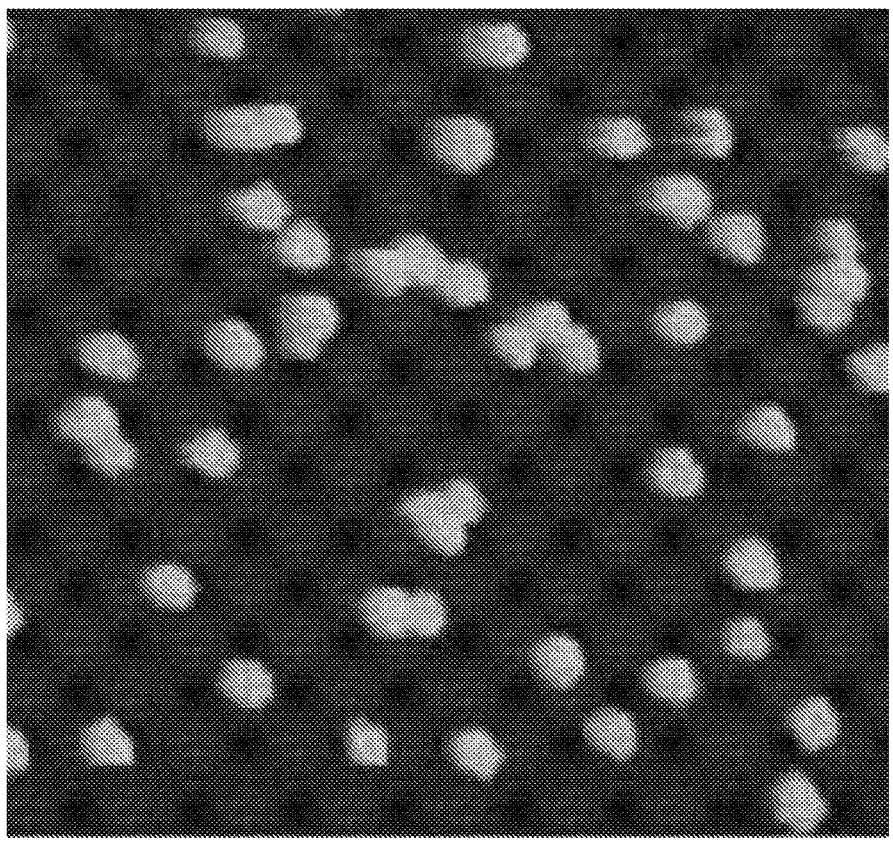
FIG. 3B is an AFM image of a dispersion of comparative nanoparticles in in octofluoropentanol.

For the purpose of comparison, the untreated nanoparticles were dispersed in OFP. Compared to the dispersion illustrated in FIG. 3A, the dispersion of the untreated nanoparticles in OFP showed a relatively high degree of aggregation as shown in the AFM image of FIG. 3B.

Example 2

A formulation was formed by dissolving an electron-transporting polymer comprising Electron-Transporting Repeat Unit 1 as described in WO 2012/133229, the contents of which are incorporated herein by reference, in a methanol/water solvent (70/30 v/v) and dispersing the nanoparticles having BF4$^-$ anions described in Example 1 in the solvent.

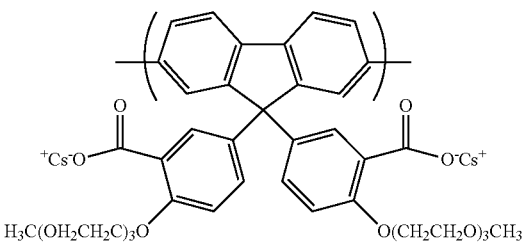

Electron-Transporting Repeat Unit 1

A film was formed by depositing the formulation onto a glass substrate by spin-coating and evaporating the solvent. A uniform dispersion of nanoparticles in the electron-transporting polymer was observed by AFM.

A comparative composition was formed in which the nanoparticles having BF4$^-$ anions were replaced with nanoparticles of Example 1 prior to anion exchange with BF4$^-$ anions. Casting of this formulation to form a film was not possible to due strong aggregation of the nanoparticles.

Example 3

A white light-emitting OLED device having the following structure was formed:

ITO (150 nm)/HIL (35 nm)/LEL(R) (20 nm)/LEL (G,B) (65 nm)/ETL (40 nm)/Cathode in which ITO is an indium tin oxide anode; HIL is a hole-injection layer; HTL is a hole-transporting layer; LEL (R) is a hole-transporting layer containing a red phosphorescent emitter and LEL (G,B) is a light-emitting layer containing a blue phosphorescent emitter and a green phosphorescent emitter; and ETL is an electron-transporting layer.

To form the device, a PEN substrate carrying ITO was cleaned using UV/Ozone. The hole-injection layer was formed by spin-coating an aqueous formulation of a hole-injection material available from Nissan Chemical Industries. The hole-transporting layer was formed by spin-coating an o-xylene solution of a crosslinkable hole-transporting polymer containing a red phosphorescent metal complex and crosslinking the polymer by heating. The light-emitting layer was formed by spin-coating an o-xylene solution of a host material, a blue phosphorescent metal complex and a green phosphorescent metal complex. The electron-transporting layer was formed by spin-coating Polymer Example 2 onto the crosslinked light-emitting layer and spin-coating a formulation of n-dopant 1 (30 wt %) and Electron Transport Polymer 1 (70 wt %) from methanol solution and heating at 80° C. for 10 minutes. The cathode was formed by evaporation of a first layer of sodium fluoride (2 nm), a second layer of magnesium (100 nm) and a third layer of silver (100 nm).

Although the present invention has been described in terms of specific exemplary embodiments, it will be appreciated that various modifications, alterations and/or combinations of features disclosed herein will be apparent to those skilled in the art without departing from the scope of the invention as set forth in the following claims

The invention claimed is:

1. A cationic nanoparticulate material comprising nanoparticles comprising a counterion selected from $BF_4^-$, $PF_6^-$ and $SbF_5^-$.

2. The cationic nanoparticulate material according to claim 1 wherein the nanoparticles comprise a polymer.

3. The cationic nanoparticulate material according to claim 2 wherein the polymer comprises a styrene repeat unit substituted with a cationic group.

4. The cationic nanoparticulate material of claim 2, wherein the polymer has a repeat unit substituted with at least one cationic substituent.

5. The cationic nanoparticulate material of claim 4, wherein the repeat unit is of formula (Ia):

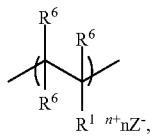

(Ia)

wherein
n is at least 1;
$R^6$ in each occurrence is independently H or a non-ionic substituent;
$R^1$ is a group of formula (II):

(II), wherein $Sp^1$ is a non-ionic spacer group; z is 0 or 1; and X is a cationic group.

6. The cationic nanoparticulate material of claim 5, wherein X is a group of formula (III):

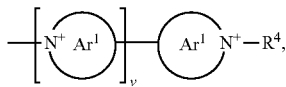

(III)

wherein
$Ar^1$ independently in each occurrence is a $C_{6-20}$ monocyclic or polycyclic heteroaromatic group which may be unsubstituted or substituted with one or more substituents;
$R^4$ is a substituent; and
v is 0 or 1.

7. A composition comprising the cationic nanoparticulate material according to claim 1 and an organic semiconducting material.

8. The composition according to claim 7 wherein the organic semiconducting material is a polymer.

9. The composition according to claim 7 wherein the organic semiconducting material is an electron-transporting material.

10. The composition according to claim 7 wherein the organic semiconducting material is substituted with an ionic substituent.

11. A formulation comprising a solvent and a cationic nanoparticulate material comprising nanoparticles comprising a counterion selected from $BF_4^-$, $PF_6^-$ and $SbF_5^-$ or a composition according to claim 7.

12. The formulation according to claim 11 wherein the solvent comprises at least one polar solvent material.

13. An organic electronic device comprising a layer comprising the composition according to claim 7.

14. The organic electronic device according to claim 13 wherein the device is an organic light-emitting device.

15. The organic electronic device according to claim 14 wherein the organic light-emitting device comprises an anode, a cathode, a light-emitting layer between the anode and the cathode and an electron-transporting layer or electron-injecting layer between the light-emitting layer and the cathode wherein the electron-transporting layer or electron-injecting layer comprises the composition.

16. The organic electronic device according to claim 15 wherein the cathode comprises a metal layer.

17. The organic electronic device according to claim 15 wherein the organic light-emitting device is a white light-emitting device.

18. A method of forming the organic electronic device according to claim 13, wherein the layer comprising the composition is formed by depositing a formulation comprising a solvent and the composition onto a surface and evaporating the solvent.

19. The method according to claim 18 wherein the organic electronic device is an organic light-emitting device and the surface is a surface of a light-emitting layer of the organic light-emitting device.

20. The cationic nanoparticulate material of claim 1, wherein the nanoparticles have a diameter of about 10 nm to about 200 nm.

* * * * *